United States Patent
Banerjee et al.

(10) Patent No.: US 10,797,152 B2
(45) Date of Patent: Oct. 6, 2020

(54) PROCESS OF FORMING AN ELECTRONIC DEVICE INCLUDING AN ACCESS REGION

(71) Applicant: SEMICONDUCTOR COMPONENTS INDUSTRIES, LLC, Phoenix, AZ (US)

(72) Inventors: Abhishek Banerjee, Kruibeke (BE); Piet Vanmeerbeek, Sleidinge (BE); Peter Moens, Erwetegem (BE); Marnix Tack, Merelbeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/997,122

(22) Filed: Jun. 4, 2018

(65) Prior Publication Data

US 2019/0371909 A1  Dec. 5, 2019

(51) Int. Cl.
*H01L 29/66* (2006.01)
*H01L 29/20* (2006.01)
*H01L 21/28* (2006.01)
*H01L 29/423* (2006.01)
(Continued)

(52) U.S. Cl.
CPC .. *H01L 29/66462* (2013.01); *H01L 21/28264* (2013.01); *H01L 29/2003* (2013.01); *H01L 29/205* (2013.01); *H01L 29/4236* (2013.01); *H01L 29/7787* (2013.01)

(58) Field of Classification Search
CPC ........... H01L 29/66462; H01L 29/4236; H01L 29/2003; H01L 21/28264; H01L 29/205; H01L 29/7787
See application file for complete search history.

(56) References Cited

U.S. PATENT DOCUMENTS

| 5,447,874 A | 9/1995 | Grivna et al. |
| 7,939,391 B2 | 5/2011 | Suh et al. |
| 9,070,705 B2 | 6/2015 | Banerjee et al. |

(Continued)

OTHER PUBLICATIONS

Watanabe et al.; "Design and Control of Interface Reaction Between Al-based Dielectrics and AlGaN Layer for Hysteresis-fee AlGaN/GaN MOS-HFETs"; Proc. of the 29th Int'l Syp. on Power Semiconductor Devices & ICs; IEEE (publisher);.2017; pp. 219-22.

(Continued)

*Primary Examiner* — Thanh T Nguyen

(74) *Attorney, Agent, or Firm* — Abel Schillinger, LLP

(57) ABSTRACT

An electronic device can include a channel layer; an access region having an aluminum content substantially uniform or increasing with distance from the channel layer; and a gate dielectric layer overlying and contacting the channel layer. A process of forming an electronic device can include providing a substrate and a channel layer of a III-V semiconductor material over the substrate; forming a masking feature over the channel layer; and forming an access region over the channel layer. In an embodiment, the channel layer can include GaN, and the access region has an aluminum content that is substantially uniform or increases with distance from the channel layer. In another embodiment, the process can include removing at least a portion the masking feature and forming a gate dielectric layer over the channel layer. A dielectric film of the masking feature or the gate dielectric layer contacts the channel layer.

8 Claims, 4 Drawing Sheets

(51) Int. Cl.
*H01L 29/778* (2006.01)
*H01L 29/205* (2006.01)

(56) References Cited

U.S. PATENT DOCUMENTS

| | | |
|---|---|---|
| 2013/0313613 A1 | 11/2013 | Khan et al. |
| 2014/0252371 A1* | 9/2014 | Kwak ............... H01L 29/66431 |
| | | 257/76 |
| 2016/0163846 A1 | 6/2016 | Liu et al. |
| 2019/0206998 A1* | 7/2019 | Huang ................ H01L 29/0843 |

OTHER PUBLICATIONS

Zheng et al.; Selective Area Growth: A Promising Way for Recessed Gate GaN MOSFET with High Quality MOS Interface: IEEE Electron Device Letters; vol. 37, No. 9, 2016; pp. 1193-1196.

* cited by examiner

PROCESS OF FORMING AN ELECTRONIC DEVICE INCLUDING AN ACCESS REGION

FIELD OF THE DISCLOSURE

The present disclosure relates to electronic devices and processes of forming electronic devices, and more particularly to, electronic devices including access regions and processes of forming the same.

RELATED ART

High electron mobility transistors can be enhancement-mode transistors. One type of such transistor can include a p-type GaN gate structure. Typically, a barrier layer is etched and the p-type GaN is formed within the opening. Transistors with p-type GaN gate structures typically have higher dynamic on-state resistance due to plasma-induced damage from a pGaN etch in access regions. The transistor can also have relatively high on-state gate leakage as compared to depletion-mode high electron mobility transistors. When the p-type GaN includes Mg, some Mg may diffuse into the GaN channel layer and increase on-state resistance.

Alternatively, an enhancement-mode transistor can be formed with a dielectric layer as part of the gate structure. A barrier layer can be etched and cause plasma damage that generates interface states or traps between the etched (plasma damaged) semiconductor surface and a subsequently-deposited gate dielectric. This can cause high hysteresis, threshold voltage instability, and relatively higher gate leakage and relatively lower drive current as compared to a depletion-mode high electronic mobility transistor. Further improvement of enhancement-mode high electron mobility transistors without the previously mentioned adverse complications is desired.

BRIEF DESCRIPTION OF THE DRAWINGS

Embodiments are illustrated by way of example and are not limited in the accompanying figures.

Figure 1:
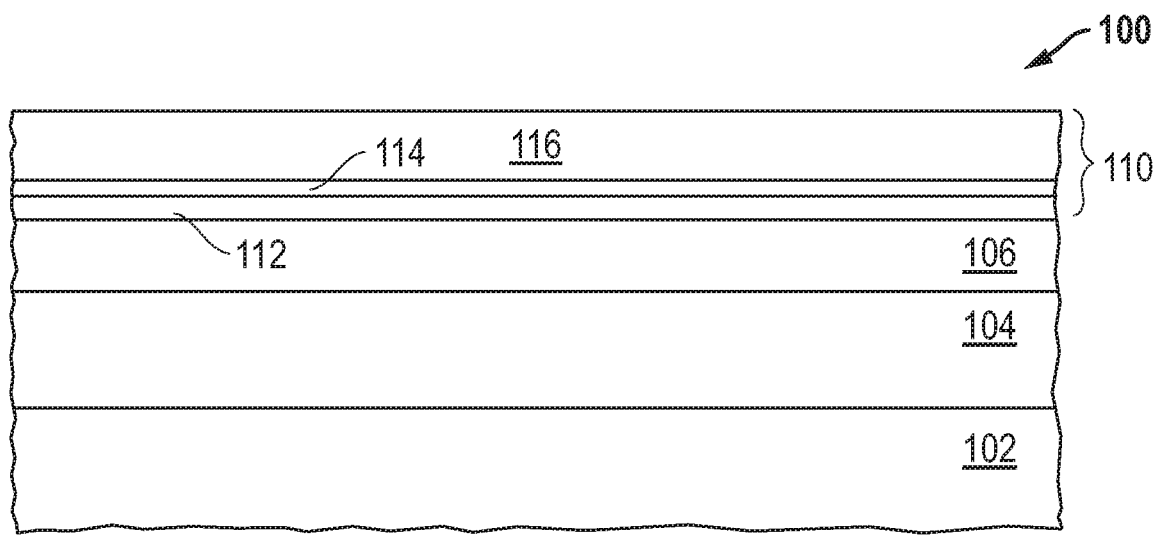
FIG. 1 includes an illustration of a cross-sectional view of a portion of a workpiece including a substrate, a buffer layer, a channel layer, and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers corresponding to columns within the Periodic Table of Elements are based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An enhancement-mode high electron mobility transistor (HEMT) can be formed by protecting a portion of a channel layer with a masking feature at a location where the gate structure will be formed, and then forming an access region over an exposed portion of the channel layer. A relatively high quality interface can be formed between a channel layer and gate dielectric layer. The process as described in more detail below may have a reduced density of interface states along the interface between the channel layer and the gate dielectric layer. Furthermore, a p-type GaN layer is not formed as part of the gate structure, so diffusion of a p-type dopant (e.g., Mg) from the p-type GaN into the channel layer is obviated. Still further, the enhancement-mode HEMT as described below can have a gate structure that can be driven to a higher voltage as compared to the p-type GaN gate structure. In a particular embodiment, the gate dielectric layer contacts a GaN channel layer, and the HEMT has a lower leakage current because, within a gate opening, an AlGaN layer is not present between the gate structure and the channel layer.

A channel layer can be protected by a masking feature before forming an access region without having to etch through a barrier layer to expose the channel layer. A dielectric film can be formed that contacts the channel layer, where the dielectric film is formed or annealed at a relatively high temperature, such as at a temperature of 1000° C. or higher.

In another embodiment, the dielectric material of the dielectric film may have a plurality of different crystalline phases. A dielectric film can be selected, so that the particular phase of the dielectric material of the dielectric film has a lattice constant that is closer to the lattice constant of the semiconductor material of the channel layer, as compared to any other crystalline phase of the dielectric material. For example, when the channel layer includes GaN, GaN has a lattice constant that is closer to the lattice constant of beta alumina ($NaAl_{11}O_{17}$) than the lattice constant of alpha alumina (corundum). Thus, beta alumina will cause less stress on GaN as compared to alpha alumina. If needed or desired, a stability may be added to reduce the likelihood that the crystalline phase changes to a different crystalline phase (e.g., adding 0.1 mol % to 10 mol % of $Y_2O_3$, CaO, or the like to $ZrO_2$ to keep the crystalline phase from changing as the temperature is lowered).

Different techniques can be used to form the relatively high quality interface. The dielectric film may be form in-situ with formation of the channel layer or may be formed ex-situ. When an ex-situ process is used, the exposed surface of the channel layer may be cleaned in a reaction chamber before depositing the dielectric film in such chamber. The dielectric film can be deposited using inorganic precursors, metalorganic chemical vapor deposition (MOCVD), atomic layer deposition, or the like.

In an aspect, a process of forming an electronic device can include providing a substrate and a channel layer over the substrate, wherein the channel layer includes GaN; forming a masking feature over the channel layer; and forming an access region over and in contact with the channel layer while the masking feature is present over the portion of the channel layer, wherein the access region has an aluminum content that is substantially uniform or increases with distance from the channel layer.

In another aspect, a process of forming an electronic device can include providing a substrate and a channel layer over the substrate, wherein the channel layer includes a III-V semiconductor material; forming a masking feature over the channel layer; forming an access region over the channel layer; removing at least a portion the masking feature after forming the access region; and forming a gate dielectric layer over the channel layer after removing the at least a portion of the masking feature. Forming the masking feature, forming the gate dielectric layer, or both can include depositing a first dielectric film using metal-organic chemical vapor deposition, wherein the first dielectric film contacts the channel layer.

In a further aspect, an electronic device can include a channel layer including GaN; an access region including a III-V semiconductor material and defining a gate opening, wherein the access region and the channel layer have different compositions, and an aluminum content in the access region is substantially uniform or increases with distance from the channel layer; and a gate dielectric layer overlying and contacting the channel layer and within the gate opening.

FIG. 1 includes a cross-sectional view of a portion of a workpiece that includes a HEMT 100. The HEMT 100 can include a substrate 102, a buffer layer 104, a channel layer 106, and a dielectric layer 110. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, include $Al_xGa_{(1-x)}N$, where $0 \leq x \leq 1$. The composition of the buffer layer 104 may depend on the composition of the channel layer 106 and the designed operating voltage of the HEMT 100. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the buffer layer 104 near the substrate 102 can be 10 atomic % to 100 atomic % Al with the remainder Ga, and the cation content in the buffer layer 104 near the channel layer 106 can be 0 atomic % to 50 atomic % Al with the remainder Ga. In another embodiment, the buffer layer 104 can include a plurality of films. The buffer layer 104 can have a thickness in a range of approximately 1 micron to 5 microns.

The channel layer 106 can include $Al_yGa_{(1-y)}N$, where $0 \leq y \leq 0.1$ and have a thickness in a range of approximately 20 nm to 4000 nm. In a particular embodiment, the channel layer 106 is a GaN layer (y=0). The channel layer 106 may be unintentionally doped or doped with an electron donor (n-type) dopant or an electron acceptor (p-type) dopant. A high density two dimensional electron gas (2 DEG) can be formed near the interface of the channel layer 106 and a subsequently-formed access region and is responsible for high mobility and lower resistivity of the transistor structure when in the on-state. Any reduction of the 2 DEG electrons will increase the on-resistance of the transistor. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and, such carbon can result in unintentional doping. The carbon content may be controlled by controlling the deposition conditions, such as the deposition temperature and flow rates. In an embodiment, the channel layer 106 has a carrier impurity concentration that is greater than 0 and less than $1 \times 10^{14}$ atoms/cm³, less than $1 \times 10^{15}$ atoms/cm³, or less than $1 \times 10^{16}$ atoms/cm³, and in another embodiment, at most $1\times10^{16}$ atoms/cm$^3$. In a further embodiment, the carrier impurity concentration is in a range from $1\times10^{13}$ atoms/cm$^3$ to $1\times10^{16}$.

In an embodiment, the channel layer 106 has a thickness that is at least 50 nm. When the thickness is less than 50 nm, a 2 DEG may be more difficult to generate, maintain, or both. In another embodiment, the channel layer 106 has a thickness that is at most 5000 nm. In a particular embodiment, the thickness in a range of 50 nm to 300 nm can provide sufficiently thick channel layer 106 to allow for the proper generation and maintaining of the 2 DEG and still obtain a reasonable on-state resistance ($R_{DSON}$).

The buffer layer 104 and the channel layer 106 are formed using an epitaxial growth technique, and thus the channel layer 106 and at least a portion of the buffer layer 104 can be monocrystalline. In a particular embodiment, metal-containing films can be formed using metalorganic chemical vapor deposition.

A dielectric layer 110 can be formed over the channel layer 106 and can include an interface film 112, an etch-stop film 114, and a capping film 116. The interface film 112 can be formed in contact with the channel layer 106 using a technique to achieve a desired interface between the channel layer 106 and the interface film 112. The interface film 112 can have a variety of compositions that may be depend on the composition of the channel layer 106. In an embodiment, the interface film 112 may include a nitride, an oxide, or an oxynitride. An exemplary material can include $Si_3N_4$, $Al_2O_3$, $ZrO_2$, $HfO_2$, $SiO_2$, $TiO_2$, $Ta_2O_5$, $Nb_2O_5$, another suitable metal oxide, or a corresponding oxynitride.

The deposition technique may depend on the particular material being formed for the interface film 112. For $Si_3N_4$, the interface film 112 can be formed using a silicon halide and a nitrogen-containing source gas. In an embodiment, the silicon halide can include $SiH_3Cl$, $SiH_2Cl_2$, $SiHCl_3$, or the like, and the nitrogen-containing gas can include $NH_3$, $N_2$, $N_2O$, $N_2H_4$, or the like. In a particular embodiment, $SiH_2Cl_2$ and $NH_3$ can be used as source gases, and the deposition can be performed at a temperature of at least 1000° C. to form $Si_3N_4$. In a particular embodiment, the deposition may be performed at a temperature of at most 1150° C. The deposition at a relatively high temperature (as compared to a conventional deposition at a temperature in a range of 750° C. to 850° C.) allows for a relatively high quality interface to be formed between the channel layer 106 and the interface film 112.

Metal oxides and metal oxynitrides may be formed using MOCVD, ALD, or inorganic CVD (to distinguish from MOCVD). The metal precursor can be a metal hydride, a metal halide, a metal alkane, a metal alkoxide, or a metal amine or amide. The metal halide may or may not be in the form of a hydrate. An aluminum source gas can include trimethyl aluminum ($Al(CH_3)_3$), aluminum chloride hexahydrate ($AlCl_3.6H_2O$), aluminum bromide ($AlBr_3$) or the like. An oxygen source gas can include $O_2$, $O_3$, $H_2O$, $N_2O$, or the like.

A hafnium source gas can include hafnium butoxide ($Hf(OC_4H_9)_4$) and hafnium 2-methoxymethyl-2-propoxide ($Hf(OC_4H_9OCH_3)_4$), hafnium dimethylamide ($Hf(N(CH_3)_2)_4$), hafnium diethylamide ($Hf(N(C_2H_5)_2)_4$), hafnium tetrachloride ($HfCl_4$), or the like. Zirconium and titanium have similar compounds as hafnium, where Zr or Ti is substituted for Hf. Niobium, tantalum, and vanadium may be in the form of a dimethylamide (e.g., $Nb(N(CH_3)_2)_5$), a diethylamide (e.g., $Nb(N(CH_2CH_3)_2)_5$), an ethoxide (e.g., $Nb(OC_2H_5)_5$), or the like. The deposition may be performed as a decomposition of the metal source gas or may include an oxygen source gas or a nitrogen source gas, as previously described.

If possible, deposition may be performed at a temperature of at least 1000° C. If the deposition at an appropriate temperature does not allow such a high temperature, some or all of the interface film 112 can be deposited and then annealed at a temperature of at least 600° C. For example, for ALD, the deposition may be at a temperature in a range of 300° C. to 600° C. The interface film 112 can be formed in an iterative process of a deposition of a monolayer of the metal precursor followed by an anneal of at least 600° C. The process can be iterated for at least two monolayers and for as many monolayers needed to achieve a desired thickness.

The inventors have discovered that many of the preceding formation techniques for the interface film 112 can help to form a high quality interface between the channel layer 106 and interface film 112. The high quality interface can result in a reduced density of interface states and charge carrier traps.

The continued process description regarding the dielectric layer 110 is based on the embodiment as illustrated in the figures. After reading this specification, skilled artisans will appreciate that other embodiments can be used without departing from the concepts as described herein. In an embodiment, the interface film 112 can include a silicon nitride film. The thickness of the interface film can be in a range from 10 nm to 40 nm. The etch-stop film 114 can have a different composition as compared to the capping film 116 to provide better process margin when etching the capping film 116. In an embodiment, the etch-stop film 114 can include an aluminum nitride film, and the capping film 116 can include a silicon nitride film. The etch-stop film 114 can be deposited using MOCVD although deposition using MOCVD is not required. The etch-stop film 114 is the thinnest film within the dielectric layer 110, and the capping film 116 is the thickest film within the dielectric layer 110. In an embodiment, the etch-stop film 114 can have a thickness such that a continuous film is formed over the interface film 112. In another embodiment, the etch-stop film 114 has a thickness in a range from 2 nm to 20 nm. When the interface film 112 and the capping film 116 have different compositions, the etch-stop film 114 may not use used, and thus, the etch-stop film 114 is optional. In an embodiment, the capping film 116 can have a thickness in a range from 5 nm to 120 nm.

Figure 2:
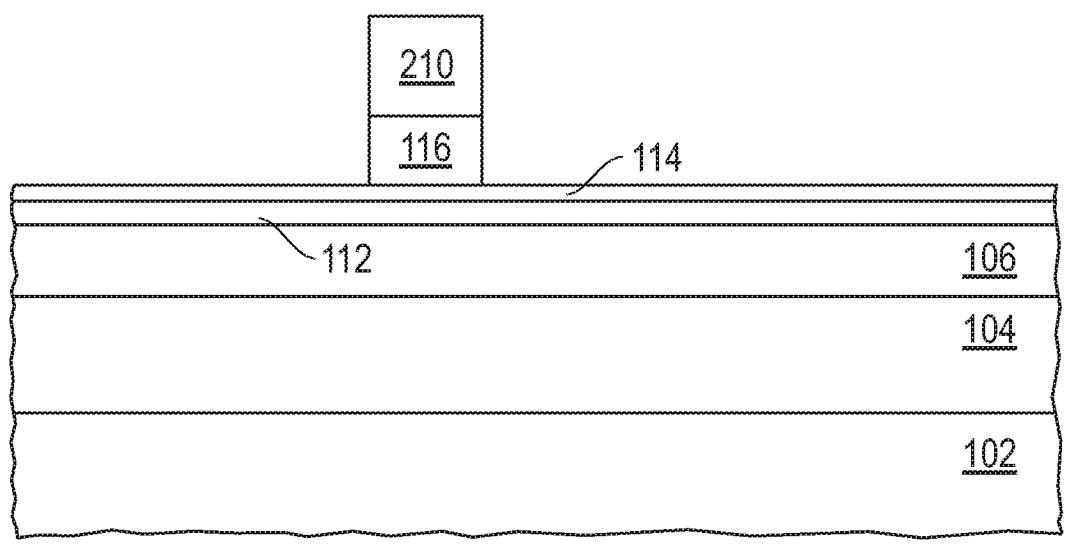
FIG. 2 includes an illustration of a cross-sectional view of the workpiece of FIG. 1 after forming a resist member and patterning a film within the dielectric layer.

FIG. 2 illustrates a cross-sectional view of the workpiece after forming a resist mask 210 and patterning the capping film 116. The location of the resist mask 210 corresponds to where a gate opening will be subsequently formed. The exposed portion of the capping film 116 is removed. In an embodiment, the removal can be performed as a dry etch using a fluorine chemistry, such as $SF_6$, $CHF_3$, $NF_3$, or the like.

Figure 3:
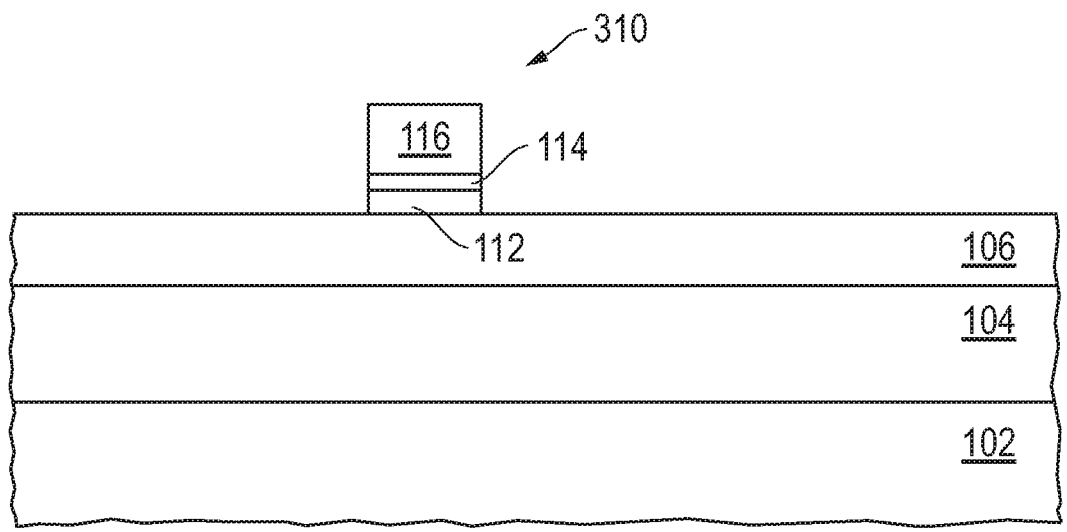
FIG. 3 includes an illustration of a cross-sectional view of the workpiece of FIG. 2 after completing formation of a masking feature.

FIG. 3 illustrates a cross-section view of the workpiece after etching exposed portions of the etch-stop film 114 and the interface film 112 to form a masking feature 310. When the etch-stop film 114 includes aluminum, the etch-stop film 114 may be etched with a chlorine chemistry, such as $BCl_3$, HCl, $Cl_2$, or the like, or wet etched using a base, such as tetramethyl ammonium hydroxide (($CH_3)_4$)NOH or TMAH), KOH, NaOH, or the like. Typically, as compared to dry etching, wet chemical etching has better selectivity to an underlying layer of a different material, such as the interface film 112, and will not cause plasma damage. When the interface film 112 includes the same material as the capping film 116, the interface film 112 can be etched using any of the etchants described with respect to the capping film 116. The interface film 112 and capping film 116 may be etched using the same etchant or different etchants.

Etching of each of the films of the dielectric layer 110 that are dry etched can be performed as timed etches, using endpoint detection, or a combination of endpoint detection with a timed overetch. After etching of the dielectric layer 110 is completed, the resist member 210 (in FIG. 2) is removed to leave the masking feature 310. The masking feature 310 lies at a location when the gate structure will reside in the finished electronic device.

Figure 4:
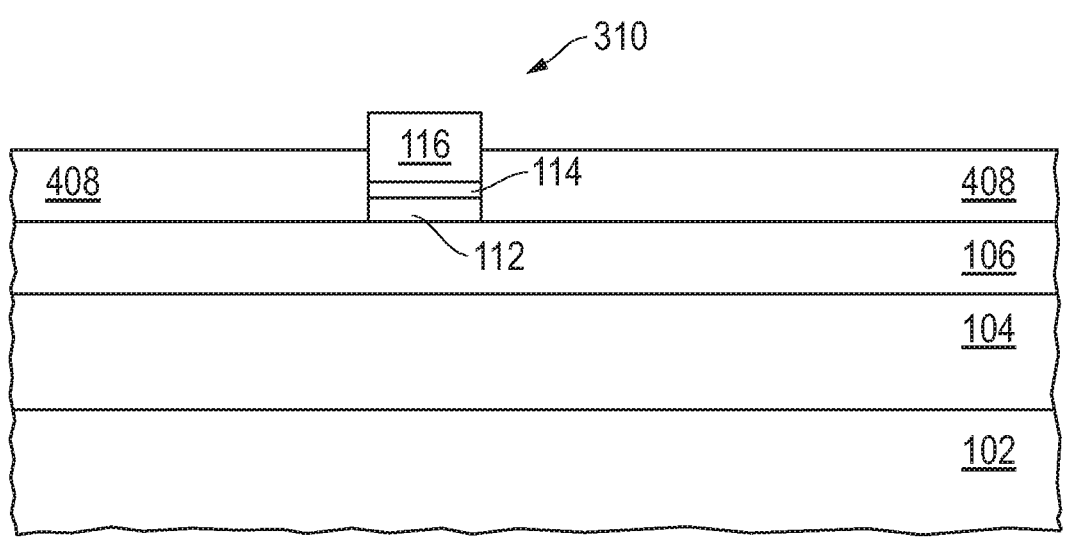
FIG. 4 includes an illustration of a cross-sectional view of the workpiece of FIG. 3 after forming an access region over a portion of the channel layer not covered by the masking feature.

FIG. 4 includes an illustration of the workpiece after an access region 408 is formed. The composition and thickness of the access region 408 can be selected to achieve a desired $R_{DSON}$. The access region 408 can include a III-V semiconductor material, such as a III-N semiconductor material. In a particular embodiment, the access region can include $Al_xIn_yGa_{(1-x-y)}N$, wherein $0 \le x \le 0.6$ and $0 \le y \le 0.3$. The access region 408 can include a single film or a plurality of films. When the access region 408 includes a plurality of films, the aluminum content can remain substantially the same or increase as distance from the channel layer 106 increases. As the aluminum content in the access region 408 increases, the thickness of the access region 408 may be relatively thinner. The thickness of the access region 408 may be less than the height of the masking feature 310. In an embodiment, the access region 408 has a thickness of at least 10 nm, at least 15 nm, or at least 20 nm, and in another embodiment, the access region 408 has a thickness of at most 150 nm, at most 120 nm, or at most 90 nm. In a particular embodiment, the access region 408 has a thickness in a range from 20 nm to 90 nm.

The access region 408 can be formed using a selective growth technique or a blanket deposition. As illustrated in FIG. 4, the masking feature 310 keeps the access region 408 from being formed in contact with the channel layer 106 at the location where the gate structure will be subsequently formed. When a selective growth technique is used, the access region 408 may or may not have faceting adjacent to the masking feature 310. Deposition parameters may be adjusted to reduce the likelihood of faceting. Alternatively (not illustrated), a blanket deposition can be used and a portion of the access region 408, originally formed over the masking feature 310, can be removed. The deposition, whether a selective growth or a blanket deposition, may be performed at a temperature in a range from 500° C. to 1100° C.

Figure 5:
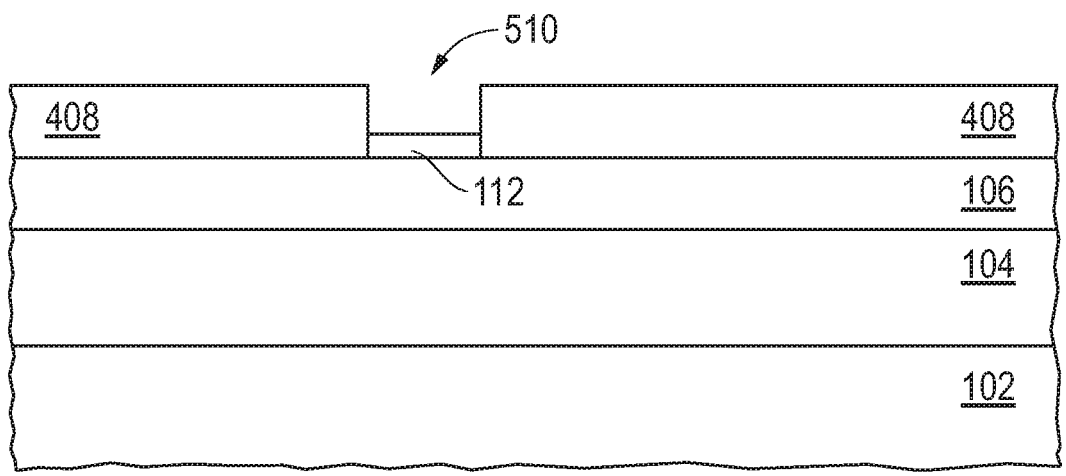
FIG. 5 includes an illustration of a cross-sectional view of the workpiece of FIG. 4 after removing dielectric films of the masking feature to define a gate opening.

FIG. 5 includes an illustration of a cross-sectional view of the workpiece after defining a gate opening 510 for the subsequently-formed gate structure. The capping film 116 and etch-stop film 114 are removed using the etching techniques previously described for such films. The interface film 112 may be retained (as illustrated) or may be removed. The decision whether to retain or remove the interface film 112 may depend on the integrity of the interface film 112 after removing the etch-stop film 114. Subsequent figures illustrate the interface film 112 being retained, even though in another embodiment it may be removed.

Figure 6:
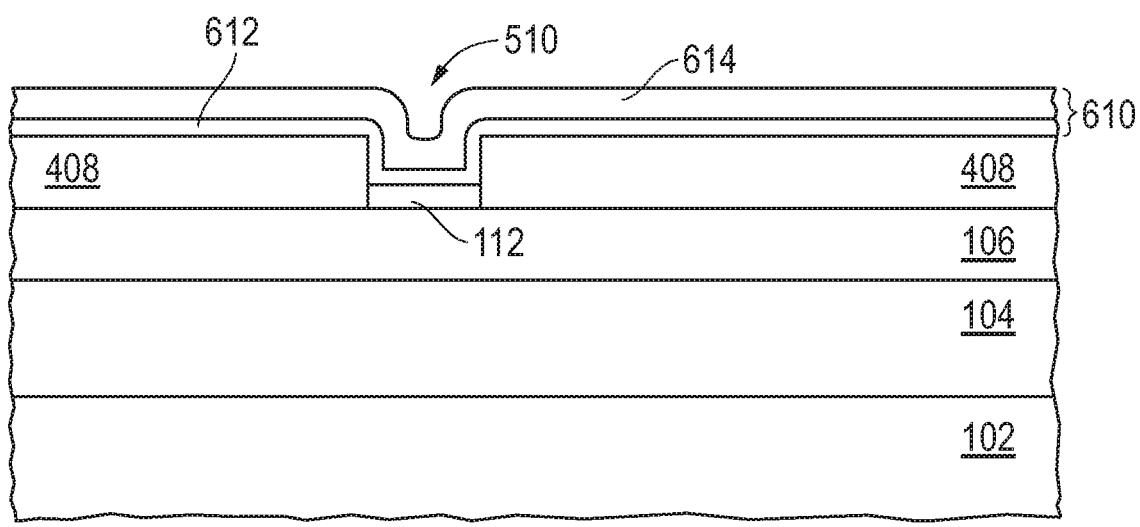
FIG. 6 includes an illustration of a cross-sectional view of the workpiece of FIG. 5 after forming a gate dielectric layer.

FIG. 6 includes an illustration of a cross-sectional view of the workpiece after forming a gate dielectric layer 610. The gate dielectric layer 610 may include a lower dielectric film 612 and an upper dielectric film 614 or may include a single dielectric film (not illustrated). The gate dielectric layer 610 may or may not include the interface film 112.

The lower dielectric film 612 can include any of the materials as previously described with respect to the interface film 112. The formation technique for the lower dielectric film 612 may depend on whether the lower dielectric film 612 contacts the channel layer 106. For example, if the interface film 112 is removed and the lower dielectric layer 612 contacts the channel layer 106, then the lower dielectric film 612 may be formed using any of the previously described techniques with respect to the interface film 112. If the interface film 112 remains and the lower dielectric layer 612 is spaced apart from the channel layer 106, the formation techniques used for the interface film 112 or another formation technique may be used. For example, when the lower dielectric film 612 includes $Si_3N_4$ and is spaced apart from the channel layer 106, the lower dielectric film 612 may be formed at a temperature in a range of 750° C. to 850° C. and does not require an anneal at a temperature of at least 1000° C.

The upper dielectric film 614 can be formed over the lower dielectric film 612. The upper dielectric film 614 can have a conduction band at a higher energy as compared to the conduction bands of each of the dielectric materials of the lower dielectric film 612 (for example, silicon nitride) and the semiconductor material of the channel layer 106 (for example GaN). The upper dielectric film 614 can have a larger bandgap energy as compared to the material of the channel layer 106. The upper dielectric film 614 can be an oxide, a nitride, or an oxynitride and may have a different composition as compared to the lower dielectric film 612. The upper dielectric film can include $Al_2O_3$, $ZrO_2$, $HfO_2$, $SiO_2$, an oxynitride of any of the foregoing oxides, or the like. The upper dielectric film 614 can be formed by chemical vapor deposition that may or may not be MOCVD or may be formed by ALD. The upper dielectric film 614 can have a thickness in a range from 5 nm to 100 nm.

Figure 7:
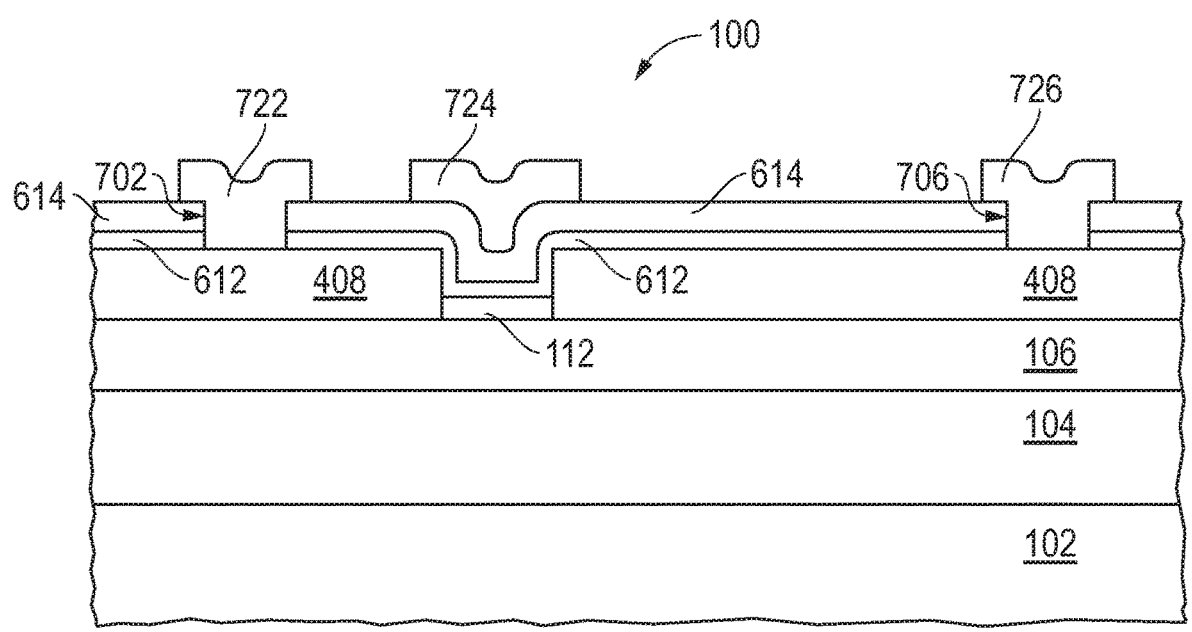
FIG. 7 includes an illustration of a cross-sectional view of the workpiece of FIG. 6 after forming source, gate, and drain electrodes.

FIG. 7 illustrates the HEMT 100 after forming source, gate, and drain electrodes 722, 724, and 726. The gate dielectric layer 610 is patterned to define a source contact opening 702 and a drain electrode opening 706. When patterning the source and drain contact openings 702 and 706, a portion of the underlying access region 408 may be removed if needed or desired.

A conductive layer is formed over the gate dielectric layer 610 and within the contact openings 702 and 706. The conductive layer can include a single film or a plurality of films. A lowermost film can set the work function of the gate electrode 724. The conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices.

The conductive layer is patterned to form the source electrode 722, the gate electrode 724, and the drain electrode 726. In another embodiment, the gate electrode 724 may be formed using a different interconnect level as compared to the source and drain electrodes 722 and 726.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device has been formed.

Embodiments as described herein can help to form an enhancement-mode HEMT that has a dielectric film in contact with the channel layer 106, where a relatively high quality interface is formed between the dielectric film and the channel layer 106. The process does not require dry etching an AlGaN barrier layer to expose a channel layer, and thus, a surface of the channel layer using the process described below can have less plasma damage since it is not exposed to the plasma during the AlGaN barrier layer etch. The process as described herein can produce an enhancement-mode HEMT having a reduced density of interface states and carrier traps at the interface between the channel layer and a dielectric film within a gate dielectric layer. Furthermore, a p-type GaN layer is not formed as part of the gate structure, so diffusion of a p-type dopant (e.g., Mg) from the p-type GaN into the channel layer is obviated. Still further, the enhancement-mode HEMT can have a gate structure that can be driven to a higher voltage as compared to the p-type GaN gate structure. In a particular embodiment, the gate dielectric layer contacts a GaN channel layer, and the HEMT has a lower leakage current because, within a gate opening, an AlGaN layer is not present between the gate structure and the channel layer.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. A process of forming an electronic device can include providing a substrate and a channel layer over the substrate, wherein the channel layer includes GaN; forming a masking feature over the channel layer; and forming an access region over and in contact with the channel layer while the masking feature is present over the portion of the channel layer, wherein the access region has an aluminum content that is substantially uniform or increases with distance from the channel layer.

Embodiment 2. The process of Embodiment 1, wherein providing the substrate and channel layer includes forming the channel layer over the substrate, and forming the masking feature includes a forming a first dielectric film in-situ with and contacting the channel layer.

Embodiment 3. The process of Embodiment 1, wherein forming the access region includes depositing a layer including $Al_xIn_yGa_{(1-x-y)}N$, wherein $0 \leq x \leq 1$ and $0 \leq y \leq 0.3$.

Embodiment 4. The process of Embodiment 3, wherein forming the access region includes selectively growing the access region from the channel layer.

Embodiment 5. The process of Embodiment 3, wherein forming the access region includes forming the access region to a thickness in a range from 3 nm to 150 nm.

Embodiment 6. The process of Embodiment 1, wherein forming the masking feature includes depositing a silicon nitride film over and in contact with the channel layer, wherein depositing the silicon nitride film is performed at a temperature in a range of 1000° C. to 1150° C.

Embodiment 7. The process of Embodiment 1, further includes removing at least a part of the masking feature, and forming a gate dielectric film over the channel layer.

Embodiment 8. The process of Embodiment 7, wherein forming the masking feature further includes forming an interface film over and in contact with the channel layer, and forming a gate dielectric film over the interface film.

Embodiment 9. The process of Embodiment 7, wherein removing the at least a part of the masking feature exposes a portion of the channel layer, and forming the gate dielectric film includes forming the gate dielectric layer in contact with the channel layer.

Embodiment 10. The process of Embodiment 7, further includes forming a gate dielectric film using an iterative process of depositing a monolayer of a dielectric material using atomic layer deposition and annealing the monolayer at a temperature of at least 600° C., and at least two monolayers of the dielectric material are formed during the iterative process.

Embodiment 11. The process of Embodiment 7, wherein forming the gate dielectric film includes depositing the gate dielectric film including a dielectric material over and in contact with the channel layer, wherein the dielectric material of the gate dielectric film has a conduction band at a higher energy as compared to a conduction band of a semiconductor material of the channel layer, and the dielectric material of the gate dielectric film has a larger bandgap energy as compared to the semiconductor material of the channel layer.

Embodiment 12. A process of forming an electronic device can include:
providing a substrate and a channel layer over the substrate, wherein the channel layer includes a III-V semiconductor material;
forming a masking feature over the channel layer;
forming an access region over the channel layer;
removing at least a portion the masking feature after forming the access region; and
forming a gate dielectric layer over the channel layer after removing the at least a portion of the masking feature, wherein forming the masking feature, forming the gate dielectric layer, or both includes depositing a first dielectric film, wherein the first dielectric film contacts the channel layer.

Embodiment 13. The process of Embodiment 12, wherein depositing the first dielectric film includes $SiO_2$ or $Al_2O_3$.

Embodiment 14. The process of Embodiment 12, wherein depositing the first dielectric film includes a dielectric material that has a particular phase of a plurality of phases, wherein a semiconductor material of the channel layer has a lattice constant that is closer to the particular phase as compare to any other phase within the plurality of phases.

Embodiment 15. The process of Embodiment 12, wherein depositing the first dielectric film is performed such that a density of interface states and carrier traps along an interface between the first dielectric film and the channel layer is at most $1 \times 10^{15}$ $eV^{-1}$ $cm^{-2}$.

Embodiment 16. The process of Embodiment 12, wherein forming the gate dielectric layer includes depositing the first dielectric film.

Embodiment 17. The process of Embodiment 12, wherein forming the masking feature includes:
depositing a dielectric layer including the first dielectric film, an etch-stop film over the first dielectric film, and a capping film over the etch-stop film;

forming a resist mask over the dielectric layer;
etching an exposed portion of the dielectric layer, wherein the masking feature includes another portion of the dielectric layer that is covered by the resist mask; and removing the resist mask.

Embodiment 18. The process of Embodiment 17, removing the at least a portion the masking feature after forming the access region includes removing remaining portions of the capping film and the etch-stop film.

Embodiment 19. The process of Embodiment 18, wherein forming the gate dielectric layer includes depositing a second dielectric film over the first dielectric film, wherein a dielectric material of the second dielectric film has a conduction band at a higher energy as compared to the conduction bands of each of a dielectric material of the first dielectric film and a semiconductor material of the channel layer, and the dielectric material of the second dielectric film has a larger bandgap energy as compared to the semiconductor material of the channel layer.

Embodiment 20. An electronic device can include a channel layer including GaN; an access region including a III-V semiconductor material and defining a gate opening, wherein the access region and the channel layer have different compositions, and an aluminum content in the access region is substantially uniform or increases with distance from the channel layer; and a gate dielectric layer overlying and contacting the channel layer and within the gate opening.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a substrate and a channel layer over the substrate, wherein the channel layer includes a III-V semiconductor material;
   forming a masking feature over the channel layer;
   forming an access region over the channel layer;
   removing at least a portion the masking feature after forming the access region; and
   forming a gate dielectric layer over the channel layer after removing the at least a portion of the masking feature,
   wherein forming the masking feature, forming the gate dielectric layer, or both includes depositing a first dielectric film, wherein the first dielectric film contacts the channel layer.

2. The process of claim 1, wherein depositing the first dielectric film includes $SiO_2$ or $Al_2O_3$.

3. The process of claim 1, wherein depositing the first dielectric film comprises depositing the first dielectric film that includes a dielectric material that has a particular phase of a plurality of phases, wherein a semiconductor material of the channel layer has a lattice constant that is closer to the particular phase as compare to any other phase within the plurality of phases.

4. The process of claim 1, wherein depositing the first dielectric film is performed such that a density of interface states and carrier traps along an interface between the first dielectric film and the channel layer is at most $1\times10^{15}$ $eV^{-1}$ $cm^{-2}$.

5. The process of claim 1, wherein forming the gate dielectric layer comprises depositing the first dielectric film.

6. The process of claim 1, wherein forming the masking feature comprises:
   depositing a dielectric layer including the first dielectric film, an etch-stop film over the first dielectric film, and a capping film over the etch-stop film;
   forming a resist mask over the dielectric layer;
   etching an exposed portion of the dielectric layer, wherein the masking feature includes another portion of the dielectric layer that is covered by the resist mask; and
   removing the resist mask.

7. The process of claim 6, removing the at least a portion the masking feature after forming the access region comprises removing remaining portions of the capping film and the etch-stop film.

8. The process of claim 7, wherein forming the gate dielectric layer comprises depositing a second dielectric film over the first dielectric film, wherein a dielectric material of the second dielectric film has a conduction band at a higher energy as compared to the conduction bands of each of a dielectric material of the first dielectric film and a semiconductor material of the channel layer, and the dielectric material of the second dielectric film has a larger bandgap energy as compared to the semiconductor material of the channel layer.

* * * * *